(12) United States Patent
Huang

(10) Patent No.: US 9,606,192 B2
(45) Date of Patent: Mar. 28, 2017

(54) ALTERNATING MAGNETIC FIELD SENSING DEVICE

(71) Applicant: Nationz Technologies Inc., Shenzhen, Guangdong (CN)

(72) Inventor: Zhen Huang, Shenzhen (CN)

(73) Assignee: NATIONZ TECHNOLOGIES INC., Shenzhen, Guangdong (CN)

( * ) Notice: Subject to any disclaimer, the term of this patent is extended or adjusted under 35 U.S.C. 154(b) by 250 days.

(21) Appl. No.: 14/405,591

(22) PCT Filed: Apr. 16, 2013

(86) PCT No.: PCT/CN2013/074230
§ 371 (c)(1),
(2) Date: Dec. 4, 2014

(87) PCT Pub. No.: WO2013/181970
PCT Pub. Date: Dec. 12, 2013

(65) Prior Publication Data
US 2015/0192645 A1 Jul. 9, 2015

(30) Foreign Application Priority Data
Jun. 4, 2012 (CN) .......................... 2012 1 0180272

(51) Int. Cl.
*G01R 33/028* (2006.01)
*G01R 33/038* (2006.01)

(52) U.S. Cl.
CPC ..... *G01R 33/0286* (2013.01); *G01R 33/0385* (2013.01)

(58) Field of Classification Search
CPC ............ G01R 33/0286; G01R 33/0385; G01R 31/2891; G01R 33/00; G01R 33/02;
(Continued)

(56) References Cited

U.S. PATENT DOCUMENTS 5,675,252 A 10/1997 Podney
6,809,515 B1 10/2004 Li et al.
(Continued)

FOREIGN PATENT DOCUMENTS

| CN | 100561249 | 3/2008 | |
|---|---|---|---|
| GB | 2188157 | 9/1987 | |
| GB | 2188157 A * | 9/1987 | ............. G01R 33/02 |

OTHER PUBLICATIONS

International Search Report of the International Searching Authority for Int'l Application No. PCT/CN2013/074230, and its English translation, Jun. 27, 2013, 4 pages.

*Primary Examiner* — Son Le
(74) *Attorney, Agent, or Firm* — Young Basile Hanlon & MacFarlane, P.C.

(57) ABSTRACT

An alternating magnetic field sensing device comprises at least one magnet and at least one force-electricity converting module. The magnet is mechanically connected to the force-electricity converting module and converts a magnetic signal received in an alternating magnetic field to mechanical force and transmits the mechanical force to the force-electricity converting module. The force-electricity converting module converts the mechanical force provided by the magnet to an electrical signal.

9 Claims, 4 Drawing Sheets

(58) Field of Classification Search
CPC .... G01R 33/028; G01R 33/03; G01R 33/038;
G01R 33/06; G01R 33/07; G01R 33/075;
G01R 33/09; G01R 33/093; G01R
33/095; G01R 33/096; G01R 33/323;
G01R 15/20
See application file for complete search history.

(56) References Cited

U.S. PATENT DOCUMENTS

| | | | |
|---|---|---|---|
| 6,984,902 B1 * | 1/2006 | Huang | H02N 2/186 310/26 |
| 2002/0097040 A1 * | 7/2002 | Takizawa | B60T 8/171 324/174 |
| 2006/0066292 A1 | 3/2006 | Tadatsu | |
| 2012/0248936 A1 * | 10/2012 | Hsieh | G01R 15/183 310/339 |

* cited by examiner

ALTERNATING MAGNETIC FIELD SENSING DEVICE

CROSS-REFERENCE TO RELATED APPLICATIONS

This application is a United States National Stage Application of International Patent Application No. PCT/CN2013/074230, filed on Apr. 16, 2013, which claims the benefit of Chinese Patent Application No. 201210180272.5, filed on May 4, 2012, the entire contents of which are incorporated herein in their entirety by reference.

FIELD OF THE DISCLOSURE

The present disclosure relates to an alternating magnetic field sensing device, and belongs to the field of alternating magnetic.

BACKGROUND

In recent years, the existing alternating magnetic field sensing technical solutions, such as coils where the higher the frequency, the higher the sensitivity, have difficulty in sensing a magnetic field with lower frequency. Furthermore, it is easily affected by high-frequency interference, and sensing weak signal needs coils of a large size. Hall devices and magnetic resistance devices can sense a static magnetic field. Although static magnetic field signals can be removed by a high-pass filter, the sensor, in the presence of a magnetic environment, requires a very large dynamic range for sensing a weak magnetic field change.

SUMMARY

With respect to the drawbacks in the existing alternating magnetic field sensing techniques of being affected by high frequency interference and having low sensitivity, the present invention provides an alternating magnetic field sensing device, which has high sensitivity and is less affected by high frequency interference.

To solve the above technical problem, the present invention provides a technical solution as follows. An alternating magnetic field sensing device comprises at least one magnet and at least one force-electricity converting module.

The magnet is mechanically connected to the force-electricity converting module, the magnet converting a magnetic signal received in alternating magnetic field to mechanical force and transmitting the mechanical force to the force-electricity converting module.

The force-electricity converting module converts the mechanical force provided by the magnet to an electrical signal.

The present invention has the following benefits. The alternating magnetic field sensing device of the present invention achieves the conversion between an alternating magnetic signal and an electrical signal by converting the alternating magnetic signal to force by the magnet and converting force to the electrical signal by the force-electricity converting module. The device has high sensitivity, and is less affected by a static magnetic field and high frequency interference.

On the basis of the above technical solution, the following improvements can be made to the present invention.

Further, the alternating magnetic field sensing device also comprises a processing module. The processing module is connected to at least two force-electricity converting modules. The processing module receives the electrical signals from the at least two force-electricity converting modules, and performs comparison and calculation to obtain an interference signal.

Further, interference removed by the processing module comprises vibration interference, acceleration interference, and gravity interference.

Further, the magnet is a permanent magnet or an electromagnet.

Further, the alternating magnetic field sensing device changes the sensitivity by the electromagnet adjusting an exciting current. Further, the force-electricity converting module may be a piezoelectric device, a resistance strain device, a capacitive sensor, a photoelectric sensor, an optical fiber strain sensor, a semiconductor strain gauge sensor, a sapphire pressure sensor, or a micro-electro-mechanical pressure or a stress sensor and so on.

Further, the materials of the piezoelectric device comprise:

ceramic materials;

or piezoelectric single crystal, such as quartz, potassium sodium tartrate, and so on;

or polycrystalline piezoelectric ceramic, such as barium titanate, lead zirconate titanate, lead magnesium niobate, etc., also referred to as piezoelectric ceramic;

or polyvinylidene fluoride (PVDF);

or single crystal silicon, polycrystalline silicon.

Further, the ceramic materials comprise barium titanate ceramic, the single crystal comprises quartz, tourmaline, rochelle salts, tantalite, niobate, etc., and film materials comprise a film of zinc oxide.

Further, the alternating magnetic field sensing device also comprises a nonmagnetic counterweight, which is used to convert the change of acceleration, vibration, and the direction of gravity to mechanical force and to provide the mechanical force to the force-electricity converting module.

Further, the alternating magnetic field sensing device also comprises brackets and a housing provided outside the brackets. Both of the force-electricity converting module and the magnet are provided within the housing. The force-electricity converting module of the alternating magnetic field sensing device is fixed between the brackets. The force-electricity converting module comprises a first electrode and a second electrode.

DETAILED DESCRIPTION

The principle and features of the present disclosure will be described below in combination of accompany drawings. All the examples are used to interpret the present disclosure, and are not intended to limit the scope of the present disclosure.

Figure 1:
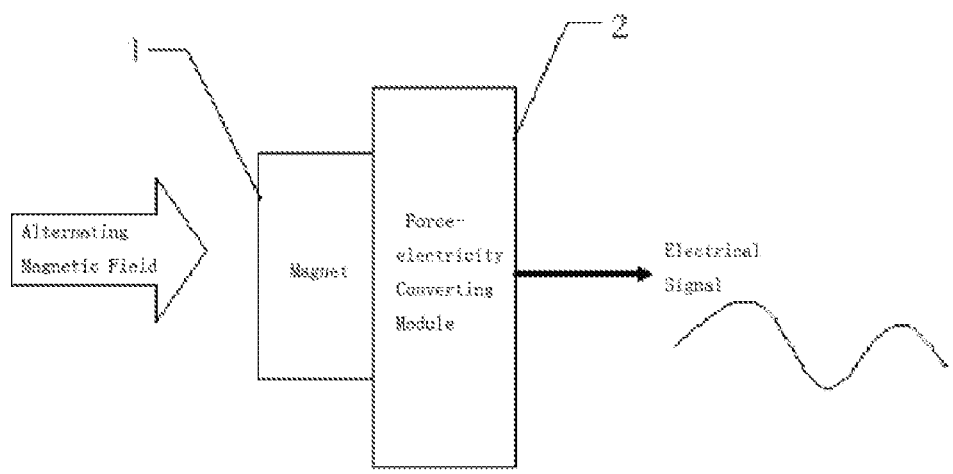
FIG. 1 is a structure diagram of an alternating magnetic field sensing device described in a first embodiment of the present invention.

As shown in FIG. 1, the alternating magnetic field sensing device described in the first embodiment of the present invention comprises a magnet 1 and a force-electricity converting module 2. The magnet 1 is mechanically connected to the force-electricity converting module 2. The magnet 1 converts a magnetic signal received in an alternating magnetic field to mechanical force and transmits the mechanical force to the force-electricity converting module 2. The force-electricity converting module 2 converts the mechanical force provided by the magnet 1 to an electrical signal.

The mechanical connection may be adhesion, solder, or any connection via an engineering and technology method of spraying or evaporating the permanent magnet materials to the force-electricity converting module 2.

The magnet 1 is an electromagnet.

The alternating magnetic field sensing device changes the sensitivity by the electromagnet adjusting an exciting current.

The force-electricity converting module 2 is a piezoelectric device.

The materials of the piezoelectric device are barium titanate ceramic.

When the alternating magnetic field sensing device is mounted, the force-electricity converting module 2 is a fixed portion.

Figure 2:
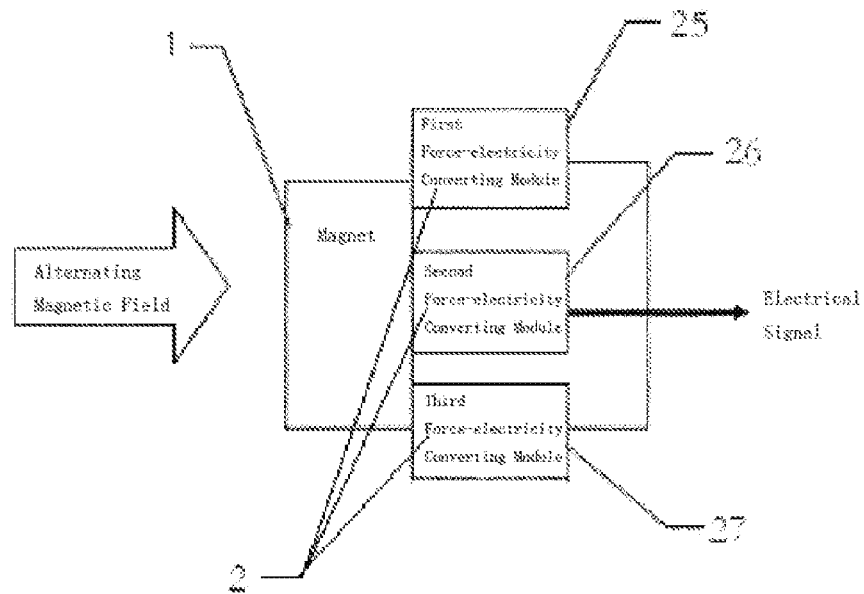
FIG. 2 is a structure diagram of an alternating magnetic field sensing device described in a second embodiment of the present invention.

As shown in FIG. 2, the alternating magnetic field sensing device described in a second embodiment of the present invention comprises one magnet 1 and three force-electricity converting modules 2. The magnet 1 is mechanically connected to a first force-electricity converting module 25, a second force-electricity converting module 26, and a third force-electricity converting module 27, respectively. The magnet 1 converts a magnetic signal received in an alternating magnetic field to mechanical force and transmits the mechanical force to the force-electricity converting modules 2. The force-electricity converting modules 2 convert the mechanical force provided by the magnet 1 to an electrical signal.

The magnet 1 is an electromagnet.

The alternating magnetic field sensing device changes the sensitivity by the electromagnet adjusting an exciting current.

The force-electricity converting modules 2 are resistance strain devices.

When the alternating magnetic field sensing device is mounted, the force-electricity converting modules 2 are a fixed portion.

Figure 3:
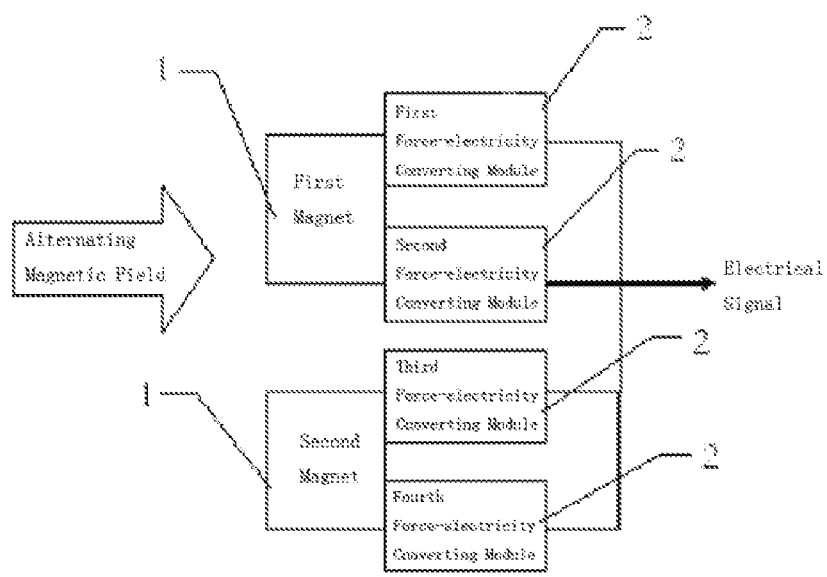
FIG. 3 is a structure diagram of an alternating magnetic field sensing device described in a third embodiment of the present invention.

As shown in FIG. 3, the alternating magnetic field sensing device described in a third embodiment of the present invention comprises two magnets 1 and four force-electricity converting modules 2. Each of the magnets 1 is mechanically connected to two force-electricity converting modules 2. The magnets 1 convert magnetic signals received in an alternating magnetic field to mechanical force and transmit the mechanical force to the force-electricity converting modules 2. The force-electricity converting modules 2 convert the mechanical force provided by the magnets 1 to an electrical signal.

The magnet 1 is an electromagnet.

The alternating magnetic field sensing device changes the sensitivity by the electromagnet adjusting an exciting current.

The force-electricity converting module 2 is a capacitive sensor. The capacitive sensor may be an electret capacitive sensor or an electrostatic capacitive sensor, which reflects the change of capacitance through the change of electric field. The capacitive sensor may alternatively be a LC, RC oscillator, which reflects the change of capacitance through the change of oscillator frequency, a RC charge and discharge circuit, which reflects the change of capacitance through the change of the circuit's time constant, or an integrator, which reflects the change of capacitance through the slope of the integrator.

When the alternating magnetic field sensing device is mounted, the force-electricity converting modules 2 are a fixed portion.

Figure 4:
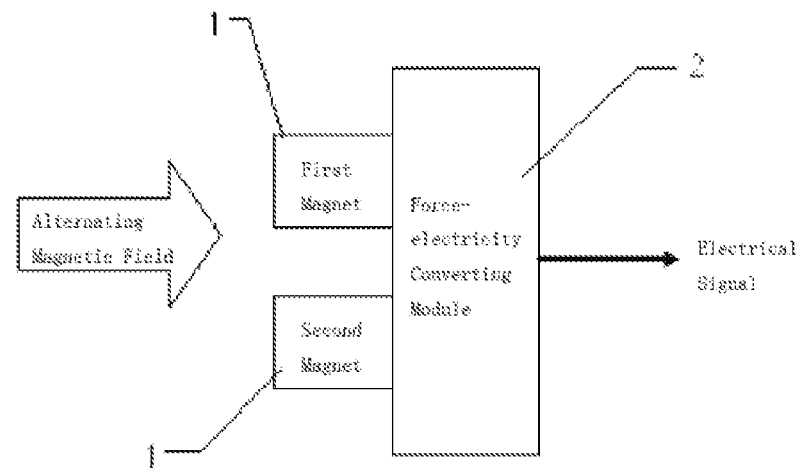
FIG. 4 is a structure diagram of an alternating magnetic field sensing device described in a fourth embodiment of the present invention.

As shown in FIG. 4, the alternating magnetic field sensing device described in a fourth embodiment of the present invention comprises two magnets 1 and one force-electricity converting module 2. These two magnets 1 are mechanically connected to the force-electricity converting module 2. The magnets 1 convert magnetic signals received in an alternating magnetic field to mechanical force and transmit the mechanical force to the force-electricity converting module 2. The force-electricity converting module 2 converts the mechanical force provided by the magnets 1 to an electrical signal.

The magnets 1 are electromagnets.

The alternating magnetic field sensing device changes the sensitivity by the electromagnet adjusting an exciting current.

The force-electricity converting module 2 is an optical fiber strain sensor.

When the alternating magnetic field sensing device is mounted, the force-electricity converting module 2 is a fixed portion.

Figure 5:
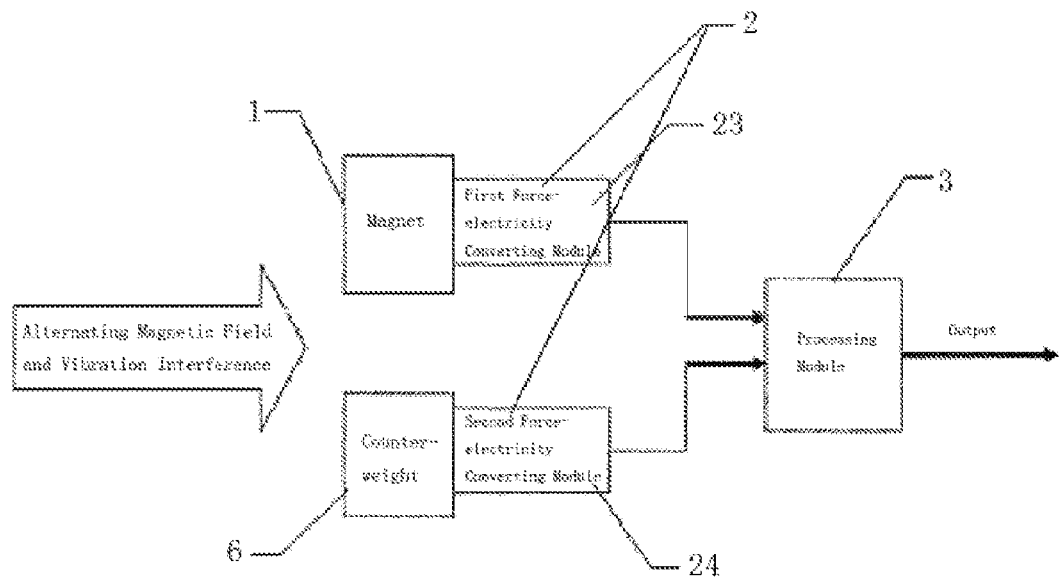
FIG. 5 is a structure diagram of an alternating magnetic field sensing device described in a fifth embodiment of the present invention.

As shown in FIG. 5, the alternating magnetic field sensing device described in a fifth embodiment of the present invention comprises one magnet 1, one counterweight 6 and two force-electricity converting modules 2. The magnet 1 is mechanically connected to a first force-electricity converting module 23 and converts an alternating magnetic field signal to magnetic force and transmits the magnetic force to the first force-electricity converting module 23. The counterweight 6 is mechanically connected to a second force-electricity converting module 24 and converts the vibration and the change of acceleration or gravity to force, and transmits the force to the second force-electricity converting module 24. The first and the second force-electricity converting modules 23 and 24 convert the two kinds of force to electrical signals respectively.

The alternating magnetic field sensing device also comprises a processing module 3. The processing module 3 is connected to two force-electricity converting modules 2, and removes the interference from magnetic field signals in the time domain or frequency domain. Specifically, the magnet 1 and the first force-electricity converting module 23 sense useful magnetic field signals and interference signals, such as vibration, etc. The counterweight 6 and the second force-electricity converting module 24 only sense the interference signals, such as vibration, etc. The processing module 3, in the time domain or frequency domain, can utilize the interference signals to counteract the interference signals in useful signals so as to remove the interference.

The interference removed by the processing module 3 comprises vibration interference, acceleration interference, and gravity interference.

The magnet 1 is an electromagnet.

The alternating magnetic field sensing device changes the sensitivity by the electromagnet adjusting an exciting current.

The force-electricity converting module 2 is a micro-electro-mechanical pressure or stress sensor.

The micro-electro-mechanical pressure or stress sensor is provided on an integrated circuit.

When the alternating magnetic field sensing device is mounted, the force-electricity converting module 2 is a fixed portion.

Figure 6:
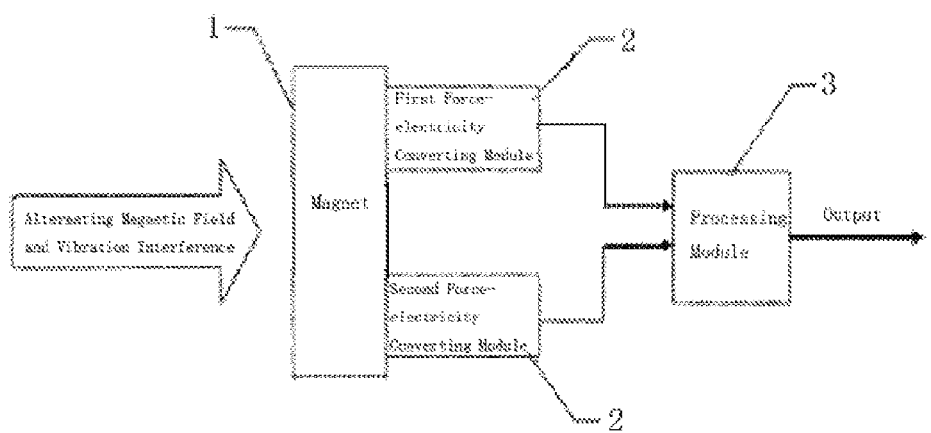
FIG. 6 is a structure diagram of an alternating magnetic field sensing device described in a sixth embodiment of the present invention.

As shown in FIG. 6, the alternating magnetic field sensing device described in a sixth embodiment 6 of the present invention comprises one magnet 1, two force-electricity converting modules 2, and one processing module 3. The magnet 1 is respectively connected to the two force-electricity converting modules 2. The magnet 1 converts a magnetic signal received in an alternating magnetic field to mechanical force and transmits the mechanical force to the force-electricity converting modules 2. The force-electricity converting modules 2 convert the mechanical force provided by the magnet 1 to electrical signals. The processing module 3 is connected to the two force-electricity converting modules 2, receives electrical signals from the two force-electricity converting modules 2, and performs comparison and calculation to obtain interference signals. The processing module 3, in the time domain or frequency domain, can utilize the interference signals to counteract the interference signals in useful signals so as to remove the interference.

The interference removed by the processing module 3 comprises vibration interference, acceleration interference, and gravity interference.

The magnet 1 is an electromagnet.

The alternating magnetic field sensing device changes the sensitivity by the electromagnet adjusting exciting current.

The force-electricity converting modules 2 are micro-electro-mechanical pressure or stress sensors.

The micro-electro-mechanical pressure or stress sensors are provided on an integrated circuit.

When the alternating magnetic field sensing device is mounted, the force-electricity converting modules 2 are fixed portions.

Figure 7:
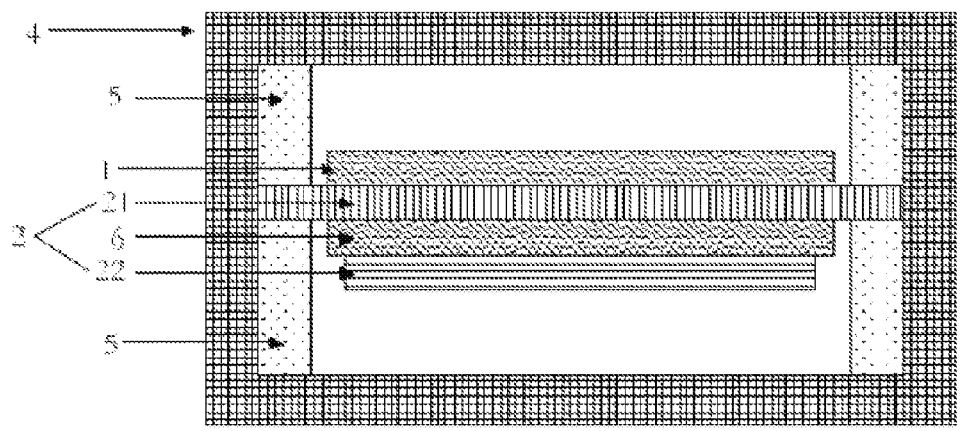
FIG. 7 is an application schematic diagram of an alternating magnetic field sensing device described in the first embodiment of the present invention.

As shown in FIG. 7, when the alternating magnetic field sensing device described in the first embodiment of the present invention is specifically applied, it is provided between brackets 5. A housing 4 is provided outside the brackets 5 and the device. The force-electricity converting module 2 of the alternating magnetic field sensing device is fixed between the brackets 5. The magnet 1 is connected to the force-electricity converting module 2. The force-electricity converting module 2 comprises a first electrode 21 and a second electrode 22, and the counterweight 6 uses piezoelectric ceramic.

The above descriptions are merely preferred embodiments, but are not used to limit the present invention. Within the spirit and principle of the present invention, any modifications, alternatives and improvements made should be comprised in the scope of the present disclosure.

What is claimed is:

1. An alternating magnetic field sensing device, comprising:
   at least one magnet and at least one force-electricity converting module; wherein
   the magnet is mechanically connected to the force-electricity converting module, the magnet converting a magnetic signal received in an alternating magnetic field to mechanical force and transmitting the mechanical force to the force-electricity converting module;
   the force-electricity converting module converts the mechanical force provided by the magnet to an electrical signal; and
   a nonmagnetic counterweight for converting a change of acceleration, vibration, and direction of gravity to mechanical force and providing the mechanical force to the force-electricity converting module.

2. The alternating magnetic field sensing device of claim 1, further comprising:
   a processing module connected to at least two force-electricity converting modules, the processing module receiving the electrical signals from the at least two force-electricity converting modules and performing comparison and calculation to obtain an interference signal.

3. The alternating magnetic field sensing device of claim 2, wherein the interference signal comprises vibration interference, gravity interference, and acceleration interference.

4. The alternating magnetic field sensing device of claim 1, wherein the at least one magnet is a permanent magnet or an electromagnet.

5. The alternating magnetic field sensing device of claim 4, wherein the alternating magnetic field sensing device changes sensitivity by the electromagnet adjusting an exciting current.

6. The alternating magnetic field sensing device of claim 1, wherein the force-electricity converting module is one of a piezoelectric device, a resistance strain device, a capacitive sensor, a photoelectric sensor, an optical fiber strain sensor, a semiconductor strain gauge sensor, a sapphire pressure sensor, or a micro-electro-mechanical pressure or stress sensor.

7. The alternating magnetic field sensing device of claim 6, wherein a material of the piezoelectric device comprises at least one of:
   a ceramic material;
   a piezoelectric single crystal;
   polycrystalline piezoelectric ceramic;
   polyvinylidene fluoride (PVDF);
   single crystal silicon, polycrystalline silicon; or
   a film material.

8. The alternating magnetic field sensing device of claim 7, wherein the ceramic material comprises barium titanate ceramic, the piezoelectric single crystal comprises at least one of quartz, tourmaline, rochelle salts, tantalite, or niobate, and the film material comprises a zinc oxide film.

9. The alternating magnetic field sensing device according to claim 1, further comprising:
   brackets; and
   a housing provided outside the brackets, wherein both the force-electricity converting module and the magnet are provided inside the housing, the force-electricity converting module fixed between the brackets and including a first electrode and a second electrode.

* * * * *